(12) United States Patent
Paull

(10) Patent No.: US 8,283,985 B2
(45) Date of Patent: *Oct. 9, 2012

(54) AUTOMATIC FREQUENCY COMPENSATION FOR PULSE WIDTH MODULATED RF LEVEL CONTROL

(75) Inventor: Ian Alan Paull, Henrietta, NY (US)

(73) Assignee: Ameritherm, Inc., Scottsville, NY (US)

( * ) Notice: Subject to any disclaimer, the term of this patent is extended or adjusted under 35 U.S.C. 154(b) by 104 days.

This patent is subject to a terminal disclaimer.

(21) Appl. No.: 12/627,348

(22) Filed: Nov. 30, 2009

(65) Prior Publication Data

US 2010/0073093 A1 Mar. 25, 2010

Related U.S. Application Data

(63) Continuation of application No. 11/844,789, filed on Aug. 24, 2007, now Pat. No. 7,626,463.

(60) Provisional application No. 60/840,046, filed on Aug. 25, 2006.

(51) Int. Cl.
*H03L 7/00* (2006.01)

(52) U.S. Cl. .......... 331/16; 323/282; 323/283; 323/288; 331/111; 331/143; 363/41; 327/175

(58) Field of Classification Search .................. 323/282, 323/283, 288; 331/16, 111, 143; 363/41; 327/175

See application file for complete search history.

(56) References Cited

U.S. PATENT DOCUMENTS

| | | | | |
|---|---|---|---|---|
| 4,459,559 | A | * | 7/1984 | Crowley .................... 331/1 A |
| 5,335,162 | A | * | 8/1994 | Martin-Lopez et al. ........ 363/97 |
| 6,229,293 | B1 | * | 5/2001 | Farrenkopf .................... 323/288 |
| 6,744,241 | B2 | * | 6/2004 | Feldtkeller ................... 323/207 |
| 6,897,640 | B2 | * | 5/2005 | Nebon et al. .................. 323/282 |
| 7,106,130 | B2 | * | 9/2006 | Gan et al. ......................... 330/10 |
| 7,138,788 | B2 | * | 11/2006 | Rice ............................. 323/268 |
| 7,378,827 | B2 | * | 5/2008 | Stoichita ...................... 323/285 |
| 2006/0055387 | A1 | * | 3/2006 | Steele ........................... 323/283 |
| 2007/0109825 | A1 | * | 5/2007 | Qiu et al. ....................... 363/41 |

* cited by examiner

*Primary Examiner* — Arnold Kinkead
*Assistant Examiner* — Richard Tan
(74) *Attorney, Agent, or Firm* — Rothwell, Figg, Ernst & Manbeck, P.C.

(57) ABSTRACT

Preferred embodiments of the present invention provide systems and methods that automatically correct the desired on-time of switching elements as the resonant frequency changes, so as to maintain the correct proportional value.

20 Claims, 2 Drawing Sheets

AUTOMATIC FREQUENCY COMPENSATION FOR PULSE WIDTH MODULATED RF LEVEL CONTROL

CROSS-REFERENCE TO RELATED APPLICATIONS

This application is a Continuation of application Ser. No. 11/844,789, filed Aug. 24, 2007, which claims priority to Provisional application Ser. No. 60/840,046, filed Aug. 25, 2006. The entire contents of the above-identified applications are incorporated herein by reference.

BACKGROUND OF THE INVENTION

1. Field of the Invention

The present invention relates to systems and methods for controlling RF output power.

2. Discussion of the Background

To address a variety of applications, RF power supplies (e.g., RF power supplies used in Induction heating) must employ a method of varying RF output power. There are many ways to accomplish this. Some architectures simply supply a variable DC source to the RF output power stage of the power supply. The result has the advantage of a continuous (rather than discontinuous) RF output with a variable and easily measurable amplitude whose heating effects and harmonics are predictable. Disadvantages of this method are that it is costly, complex and generally requires twice the silicon (in power semiconductors) than is required by a direct off-line architecture.

Varying (controlling) the RF power level using a direct off-line architecture is less costly, however this approach presents a different set of challenges to the designer. Because the DC feed to the RF output power stage (or "final power stage") cannot be directly controlled (having been simply derived directly from the AC line), another method of RF output regulation must be found. Commonly, Pulse Width Modulation (PWM) is chosen as means to accomplish this.

In PWM schemes, the final power stage is allowed to conduct during a controlled portion of each full RF cycle. Ignoring dead time between each half of the switching cycle, full power is generated when the output switching devices of the final power stage are allowed to conduct 100% of their allotted "on time," while lowering the power output is done by reducing the amount of time that the output switching devices are allowed to conduct. At 0% power they conduct 0% of the time.

If the RF frequency does not change, power can be controlled by simply allocating an absolute amount of time that the switching devices are allowed to conduct, rather than a proportional value.

In order to maintain reliable operation without greatly increasing power device costs, RF induction power supplies must appropriately respond to varying loads. To maintain high efficiencies, Induction power supplies typically resonate a capacitor or heating coil in combination with the part to be heated. As the part is heated, the natural resonant frequency of the system is affected. To be cost effective and reliable, induction supplies must respond by sensing and adjusting (varying) the operating frequency to maintain resonant operation.

To maintain a constant output power, the specific amount of time that switching devices are allowed to conduct (i.e., the "on-time") must be corrected for as resonant frequency ($f_r$) changes. More specifically, to maintain a constant power output, the switching devices must be allocated an on-time that is proportional to the cycle time (cycle time=$1/f_r$).

This can be done in a closed loop control circuit by sensing the output voltage and adjusting the switching devices on-time. Doing this affects resonant frequency sensing so that two loops are interactive and typically require compensation to slow their individual response. Another way to accomplish proportional on-time is through prediction, allowing the two loops to run independently, providing a much faster response to changing loads.

SUMMARY OF THE INVENTION

Preferred embodiments of the present invention provide systems and methods that automatically correct the desired on-time as the resonant frequency changes, so as to maintain the correct proportional value.

In some embodiments, the system includes: a voltage controlled oscillator configured to receive a tune voltage and configured to output a first signal having a frequency that corresponds to the tune voltage; a charge accumulating circuit; a voltage controlled current source configured to receive the tune voltage or a scaled tune voltage and configured to charge the charge accumulating circuit by outputting a current that corresponds to the received tune voltage or the received scaled tune voltage; a comparator configured to generate a second signal by comparing a voltage of the charge accumulating circuit to a pre-determined set point; and a circuit configured to receive the first signal and the second signal and configured to output a third signal that is a function of the first signal and the second signal, wherein the output of the circuit is coupled to the switching devices.

The system, in some embodiments, may also include an analog voltage scaling circuit, an edge detector circuit and a reset circuit, wherein the edge detector circuit and the reset circuit are configured to discharge the charge accumulating circuit at the beginning of each cycle of the first signal, and the analog voltage scaling circuit is configured to receive the tune voltage and output to the current source a scaled tune voltage.

The comparator may be configured to output a first voltage in response to the comparator determining that the voltage of the charge accumulating circuit is less than a pre-determined set point, and may be configured to output a second voltage in response to the comparator determining that the voltage of the charge accumulating circuit is greater than a pre-determined set point. The circuit that is configured to output the third signal may include or consist of a logical circuit that implements an AND function. And the charge accumulating circuit may include or consists of a capacitor.

In some embodiments, the method includes: producing a tune voltage; producing a first signal having a frequency that is dependent on the tune voltage; charging a charge accumulating circuit using the tune voltage or a scaled tune voltage; producing a second signal, wherein the step of producing the second signal comprises comparing a voltage of the charge accumulating circuit to a pre-determined set point; using the second signal to gate the first signal to the switching devices. The method may also include the act of discharging the charge accumulating circuit at the beginning of each cycle of said first signal, and using a scaling circuit to produce said scaled tune voltage. The step of producing the second signal may include: outputting a first voltage if the voltage of the charge accumulating circuit is less than a pre-determined set point; and outputting a second voltage if the voltage of the charge accumulating circuit is greater than the pre-determined set point. The step of using the second signal to gate the first signal to the switching devices may include: ANDing the first signal with the second signal to produce a third signal; and using the third signal to drive the switching devices.

The above and other features of embodiments of the present invention are described below with reference to the accompanying drawings.

BRIEF DESCRIPTION OF THE DRAWINGS

The accompanying drawings, which are incorporated herein and form part of the specification, help illustrate various embodiments of the present invention. In the drawings, like reference numbers indicate identical or functionally similar elements.

DETAILED DESCRIPTION OF PREFERRED EMBODIMENTS

Figure 1:
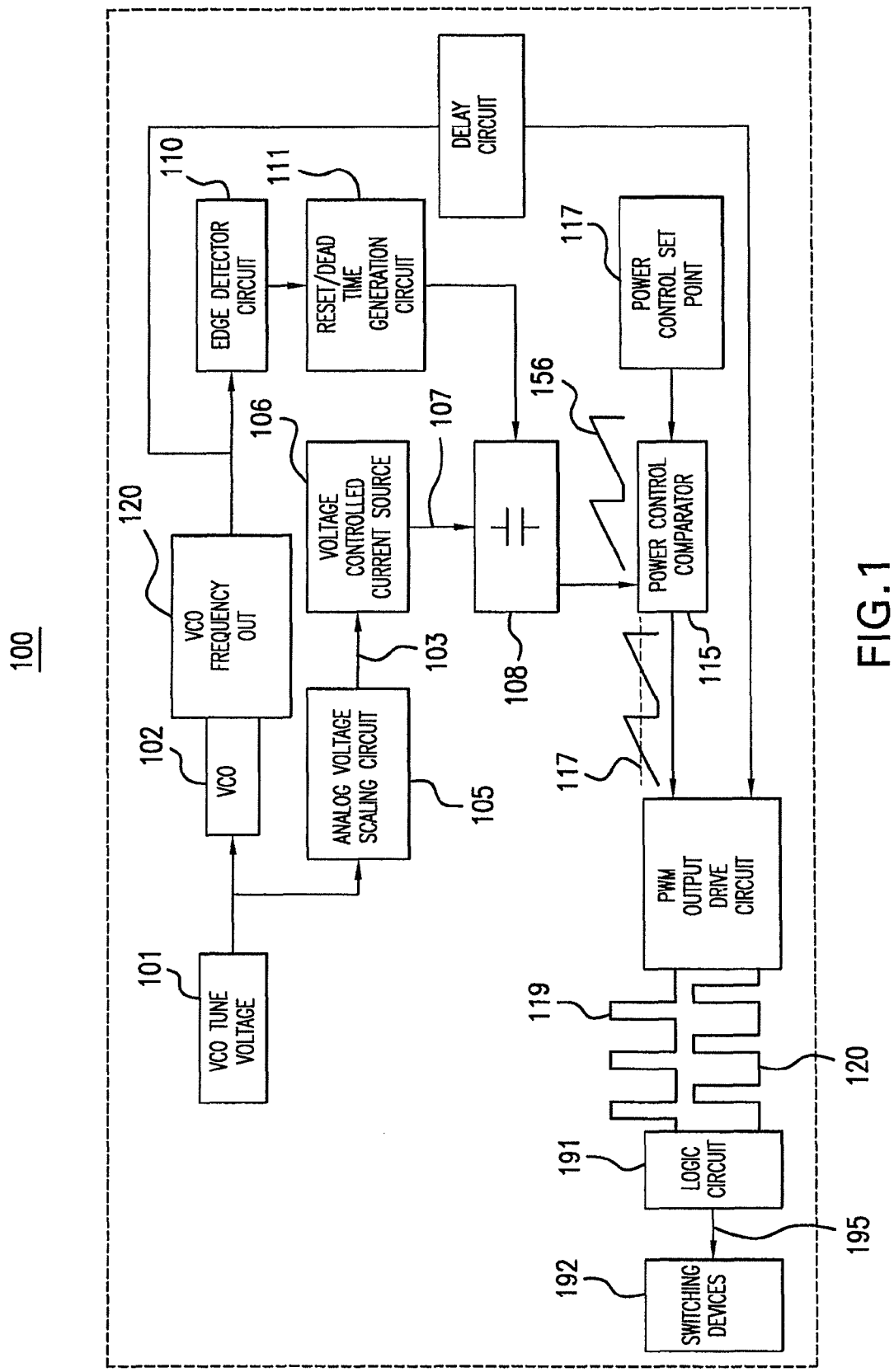
FIG. 1. is a block diagram illustrating a system according to an embodiment of the invention.

FIG. 1 illustrates a system 100 according to an embodiment of the invention. System 100 automatically allocates to switching devices (e.g., power transistors) 192 an on-time that is proportional to the cycle time.

According to an embodiment of the present invention, resonant frequency is constantly adjusted for in a closed loop that employs a voltage controlled oscillator (VCO) 102 that produces a drive signal 120. A VCO tune voltage 101, which is received by VCO 102 and controls the frequency of the drive signal 120 outputted by VCO 102, is linearly proportional to operating (resonant) frequency. This tune voltage 101 is received by and used to control a current source 106 that charges a circuit 108 that accumulates charge. Circuit 108, in preferred embodiments is a capacitor or includes one or more capacitors. Without limiting the invention, circuit 108 shall be referred to herein as "capacitor 108." As illustrated in FIG. 1, tune voltage 101 may be processed by an analog voltage scaling circuit 105 prior to being received by voltage controlled current source 106.

Because the charging current 107 produced by current source 106 is proportional to the received tune voltage 101, which is proportional to the resonant frequency ($f_r$), the charge rate of capacitor 108 is directly proportional to the resonant frequency. Thus, capacitor 108 is used to create voltage ramps 156, the slope of which is directly proportional to the frequency of drive signal 120.

As further illustrated in FIG. 1, edge detector circuit 110 in combination with reset/dead time generation circuit 111 function to discharge capacitor 108 (e.g., set the voltage of capacitor 108 to 0V at the beginning of each cycle). Thus, an increase in the frequency of drive signal 120 results in a greater capacitor 108 charging current, a greater slope to the linear voltage ramp 156, and the same voltage at the end of the RF cycle. In other words, the slope of each voltage ramp 156 adapts with frequency to reach the same voltage level at the end of each cycle. In other words, as the rate capacitor 108 is current charged is proportional to the operating frequency (i.e., the frequency of the signal produced by VCO 102), the capacitor 108 reaches the same voltage level just before discharge, regardless of the operating frequency.

As illustrated in FIG. 1, a comparator 115 compares the voltage of capacitor 108 to a pre-set voltage value 117. Comparator 115 is configured so that it outputs a first voltage (e.g., 0 volts) if the voltage of capacitor 108 is greater than or equal to the pre-set voltage value 117 and outputs a second voltage (e.g., 5 volts) if the voltage of capacitor 108 is less than the pre-set voltage value 117. Thus, comparator generates a square wave signal 119 whose duty cycle is proportional to the pre-set voltage level 117, regardless of the slope of the ramp. This signal 119 is used to gate (enable) the drive signal 120 to the power switching devices, thereby controlling their duty cycle in proportion to a desired set point, regardless of frequency.

The result yields a controllable on-time of the switching devices that automatically corrects for frequency operation, and avoids additional loop delays, complexity and cost.

Figure 2:
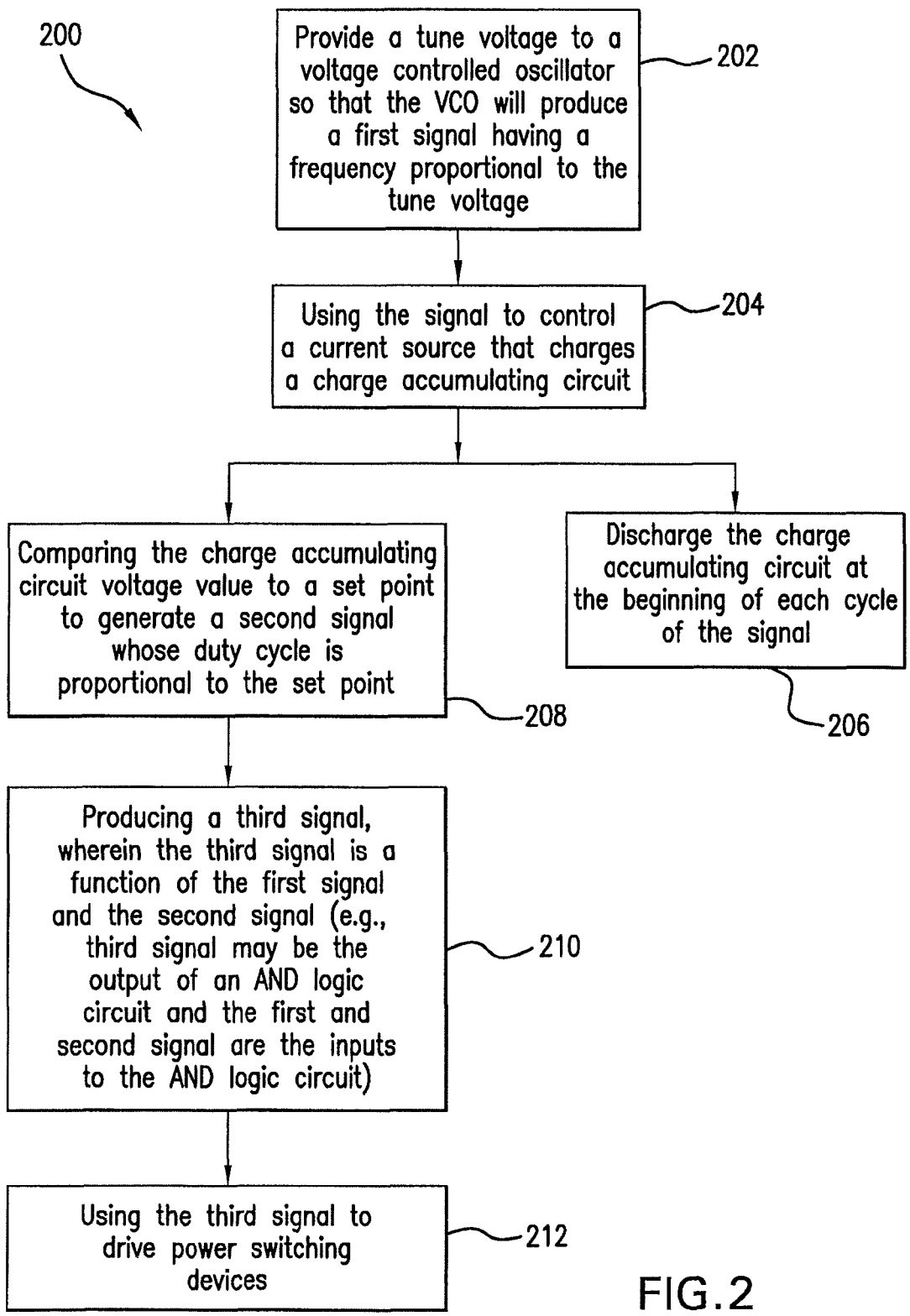
FIG. 2 is a flow chart illustrating a process according to an embodiment of the invention.

Referring now to FIG. 2, FIG. 2 is a flow chart illustrating a process 200 according to an embodiment of the invention. Process 200 may begin in step 202 where a tune voltage (e.g., tune voltage 101) is provided to a VCO (e.g., VCO 102). In response to receiving the tune voltage, the VCO produces a drive signal (e.g., a square wave drive signal) having a frequency that is dependent on and proportional to the tune voltage.

In step 204, the tune voltage is used to control a current source that charges a charge accumulating circuit (e.g., circuit 108). As described above, the step of using the tune voltage to control the current source may comprise scaling the tune voltage using a scaling circuit (e.g., an analog scaling circuit or other scaling circuit) and then using the scaled tune voltage to control the current source.

In step 206, the charge accumulating circuit is discharged at the beginning of each cycle of the drive signal. In step 208, a signal whose duty cycle is proportional to a set point is generated. The step of generating this signal includes comparing the voltage across the charge accumulating circuit to the set point.

In step 210, the signal produced in step 208 is used to gate (enable) the drive signal 120. For example, the signal produced in step 208 and the drive signal may be input to a logic "AND" circuit 191 to produce an output signal 195 that is a function of the signal produced in step 208 and the drive signal.

In step 212, the signal produced in step 210 is used to drive the power switching devices 192, thereby controlling their duty cycle in proportion to a desired set point, regardless of frequency.

While various embodiments/variations of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents. Further, unless stated, none of the above embodiments are mutually exclusive. Thus, the present invention may include any combinations and/or integrations of the features of the various embodiments.

Additionally, while the process described above and illustrated in the drawings is shown as a sequence of steps, this was done solely for the sake of illustration. Accordingly, it is contemplated that some steps may be added, some steps may be omitted, the order of the steps may be re-arranged, and some steps may be performed simultaneously.

What is claimed is:

1. A method for automatically allocating to switching devices an on-time that is proportional to a cycle time, comprising:
    using a voltage controlled oscillator to output a first signal having a frequency that corresponds to a tune voltage;
    using a voltage controlled current source to charge a charge accumulating circuit by outputting a current that corresponds to the tune voltage or a scaled tune voltage;

using a comparator that generates a second signal by comparing a voltage of the charge accumulating circuit to a pre-determined set point; and using a circuit configured to receive the first signal and the second signal to output a third signal that is a function of the first signal and the second signal, wherein the output of said circuit is coupled to the switching devices.

2. The method of claim 1, further comprising:

using an edge detector circuit and a reset circuit to discharge the charge accumulating circuit at the beginning of each cycle of said first signal.

3. The method of claim 1, further comprising:

using an analog voltage scaling circuit to receive the tune voltage and output a scaled tune voltage.

4. The method of claim 1, wherein the step of using the comparator comprises:

using the comparator to output a first voltage in response to a determination that the voltage of the charge accumulating circuit is less than a pre-determined set point, and using the comparator to output a second voltage in response to a determination that the voltage of the charge accumulating circuit is greater than a pre-determined set point.

5. The method of claim 1, wherein the circuit comprises a logical circuit that implements an AND function.

6. The method of claim 1, wherein the charge accumulating circuit consists of a capacitor.

7. The method of claim 1, wherein the charge accumulating circuit comprises a capacitor.

8. A system for automatically allocating to switching devices an on-time that is proportional to a cycle time, comprising:

an oscillator configured to receive a tune voltage and configured to output a first signal having a frequency that corresponds to the tune voltage;

a first circuit comprising a charge accumulating apparatus;

a current source configured to receive the tune voltage or a scaled tune voltage and configured to charge the charge accumulating apparatus by outputting a current that corresponds to the received tune voltage or the received scaled tune voltage;

a comparator configured to generate a second signal by comparing a voltage of the charge accumulating apparatus to a pre-determined set point; and a second circuit configured to receive the first signal and the second signal and configured to output a third signal that is a function of the first signal and the second signal, wherein the output of said second circuit is coupled to the switching devices.

9. The system of claim 8, further comprising:

an edge detector circuit; and a reset circuit, wherein the edge detector circuit and the reset circuit are configured to discharge the charge accumulating apparatus at the beginning of each cycle of said first signal.

10. The system of claim 8, further comprising a voltage scaling circuit configured to receive the tune voltage and configured to output to the current source a scaled tune voltage.

11. The system of claim 8, wherein the comparator is configured to output a first voltage in response to the comparator determining that the voltage of the charge accumulating apparatus is less than a pre-determined set point, and is configured to output a second voltage in response to the comparator determining that the voltage of the charge accumulating apparatus is greater than a pre-determined set point.

12. The system of claim 8, wherein the second circuit comprises a logical circuit that implements an AND function.

13. The system of claim 8, wherein the charge accumulating apparatus consists of a capacitor.

14. The system of claim 8, wherein the charge accumulating apparatus comprises a capacitor.

15. A method for automatically allocating to switching devices an on-time that is proportional to a cycle time, comprising:

producing a tune voltage;

producing a first signal having a frequency that is dependent on the tune voltage;

charging a charge accumulating apparatus using the tune voltage or a scaled tune voltage;

producing a second signal, wherein the step of producing the second signal comprises comparing a voltage of the charge accumulating apparatus to a pre-determined set point;

using the second signal to gate the first signal to the switching devices; and periodically discharging the charge accumulating apparatus.

16. The method of claim 15, further comprising using a scaling circuit to produce said scaled tune voltage.

17. The method of claim 15, wherein the step of producing the second signal further comprises: outputting a first voltage if the voltage of the charge accumulating apparatus is less than a pre-determined set point; and outputting a second voltage if the voltage of the charge accumulating apparatus is greater than the pre-determined set point.

18. The method of claim 15, wherein the step of using the second signal to gate the first signal to the switching devices comprises: ANDing the first signal with the second signal to produce a third signal; and using the third signal to drive the switching devices.

19. The method of claim 15, wherein the charge accumulating apparatus consists of a capacitor.

20. The method of claim 15, wherein the charge accumulating apparatus comprises a capacitor.

\* \* \* \* \*